(12) United States Patent
Kim et al.

(10) Patent No.: US 10,825,766 B2
(45) Date of Patent: Nov. 3, 2020

(54) SEMICONDUCTOR DEVICE WITH MULTI-LAYERED WIRING AND METHOD FOR FABRICATING THE SAME

(71) Applicant: SAMSUNG ELECTRONICS CO., LTD., Suwon-si (KR)

(72) Inventors: Ji Young Kim, Seoul (KR); Kyu Hee Han, Hwaseong-si (KR); Sung Bin Park, Suwon-si (KR); Yeong Gil Kim, Hwaseong-si (KR); Jong Min Baek, Seoul (KR); Kyoung Woo Lee, Hwaseong-si (KR); Deok Young Jung, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/285,583

(22) Filed: Feb. 26, 2019

(65) Prior Publication Data
US 2020/0051909 A1    Feb. 13, 2020

(30) Foreign Application Priority Data

Aug. 7, 2018   (KR) .................. 10-2018-0091638

(51) Int. Cl.
| | | |
|---|---|---|
| *H01L 23/522* | (2006.01) |
| *H01L 23/528* | (2006.01) |
| *H01L 23/532* | (2006.01) |
| *H01L 21/768* | (2006.01) |
| *H01L 21/311* | (2006.01) |

(52) U.S. Cl.
CPC .... *H01L 23/5226* (2013.01); *H01L 21/31144* (2013.01); *H01L 21/76804* (2013.01); *H01L 21/76877* (2013.01); *H01L 23/5283* (2013.01); *H01L 23/5329* (2013.01); *H01L 23/53238* (2013.01)

(58) Field of Classification Search
CPC ............. H01L 23/5226; H01L 23/5329; H01L 23/53295
USPC .................................................. 257/758–760
See application file for complete search history.

(56) References Cited

U.S. PATENT DOCUMENTS

| | | | |
|---|---|---|---|
| 6,387,824 | B1 | 5/2002 | Aoi |
| 6,660,630 | B1 | 12/2003 | Chang et al. |
| 7,354,856 | B2 | 4/2008 | Yea et al. |
| 7,807,567 | B2 | 10/2010 | Kawano et al. |
| 8,492,271 | B2 | 7/2013 | Tomita |
| 8,835,303 | B2 | 9/2014 | Feustel et al. |
| 9,728,501 | B2 | 8/2017 | Chang et al. |
| 9,917,027 | B2 | 3/2018 | Yi et al. |

(Continued)

FOREIGN PATENT DOCUMENTS

| | | |
|---|---|---|
| JP | 2010-278330 A | 12/2010 |
| KR | 2005-0069334 A | 7/2005 |

*Primary Examiner* — Matthew E Warren
(74) *Attorney, Agent, or Firm* — Lee IP Law, P.C.

(57) ABSTRACT

A semiconductor device includes a lower wiring, an interlayer insulation film above the lower wiring and including a first portion having a first density, and a second portion on the first portion, the first portion and the second portion having a same material, and the second portion having a second density smaller than the first density, an upper wiring in the second portion of the interlayer insulating film, and a via in the first portion of the interlayer insulating film, the via connecting the upper wiring and the lower wiring.

14 Claims, 12 Drawing Sheets

(56) References Cited

U.S. PATENT DOCUMENTS

| | | |
|---|---|---|
| 2005/0142864 A1 | 6/2005 | Shim |
| 2006/0084279 A1* | 4/2006 | Chang ............... H01L 21/02164 438/778 |
| 2007/0085209 A1* | 4/2007 | Lu .................... H01L 23/53295 257/758 |
| 2009/0072401 A1* | 3/2009 | Arnold ............. H01L 21/76808 257/751 |
| 2018/0309051 A1* | 10/2018 | Deshpande ............ H01L 43/02 |

\* cited by examiner

US 10,825,766 B2

SEMICONDUCTOR DEVICE WITH MULTI-LAYERED WIRING AND METHOD FOR FABRICATING THE SAME

CROSS-REFERENCE TO RELATED APPLICATION

Korean Patent Application No. 10-2018-0091638, filed Aug. 7, 2018, in the Korean Intellectual Property Office, and entitled: "Semiconductor Device and Method for Fabricating the Same," is incorporated by reference herein in its entirety.

BACKGROUND

1. Field

The present disclosure relates to a semiconductor device and a method for fabricating the same.

2. Description of the Related Art

In recent years, as down-scaling of semiconductor elements has rapidly progressed due to development of electronic techniques, higher integration and lower power consumption of semiconductor chips are required. As a result, intervals between circuit components, e.g., between wirings, gradually decrease, and an aspect ratio of the wirings increases.

SUMMARY

According to some embodiments, a semiconductor device may include a lower wiring, an interlayer insulation film above the lower wiring and including a first portion having a first density, and a second portion on the first portion, the first portion and the second portion having a same material, and the second portion having a second density smaller than the first density, an upper wiring in the second portion of the interlayer insulating film, and a via in the first portion of the interlayer insulating film, the via connecting the upper wiring and the lower wiring.

According to some embodiments, a semiconductor device may include first and second lower wirings apart from each other by a first distance, a first upper wiring disposed on the first lower wiring, and a via which connects the first lower wiring and the first upper wiring and includes a sidewall of a first slope, wherein a second distance between the second lower wiring and the via measured at the first slope is greater than the first distance.

According to some embodiments, a method for fabricating a semiconductor device may include forming a lower wiring, forming an interlayer insulating film on the lower wiring, the interlayer insulating film including a first portion having a first density, and a second portion having a second density smaller than the first density on the first portion, the first portion and the second portion including the same material, forming a first mask pattern on the interlayer insulating film, removing at least a part of the first portion of the interlayer insulating film and at least a part of the second portion of the interlayer insulating film, using the first mask pattern as an etching mask, forming a trench for exposing the lower wiring, and forming a via for filling the trench, wherein, when at least a part of the first portion of the interlayer insulating film and at least a part of the second portion of the interlayer insulating film are removed, a first etch rate of the first portion of the interlayer insulating film is smaller than a second etch rate of the second portion of the interlayer insulating film.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
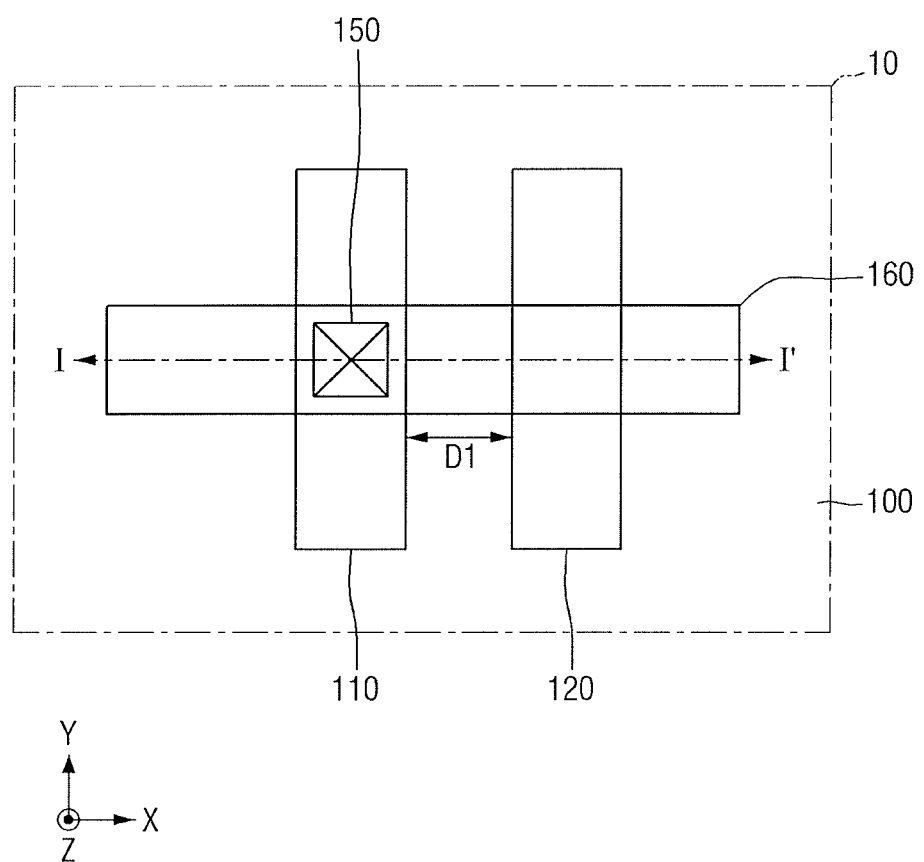
FIG. 1 illustrates a layout diagram if a semiconductor device according to some embodiments.
Figure 2:
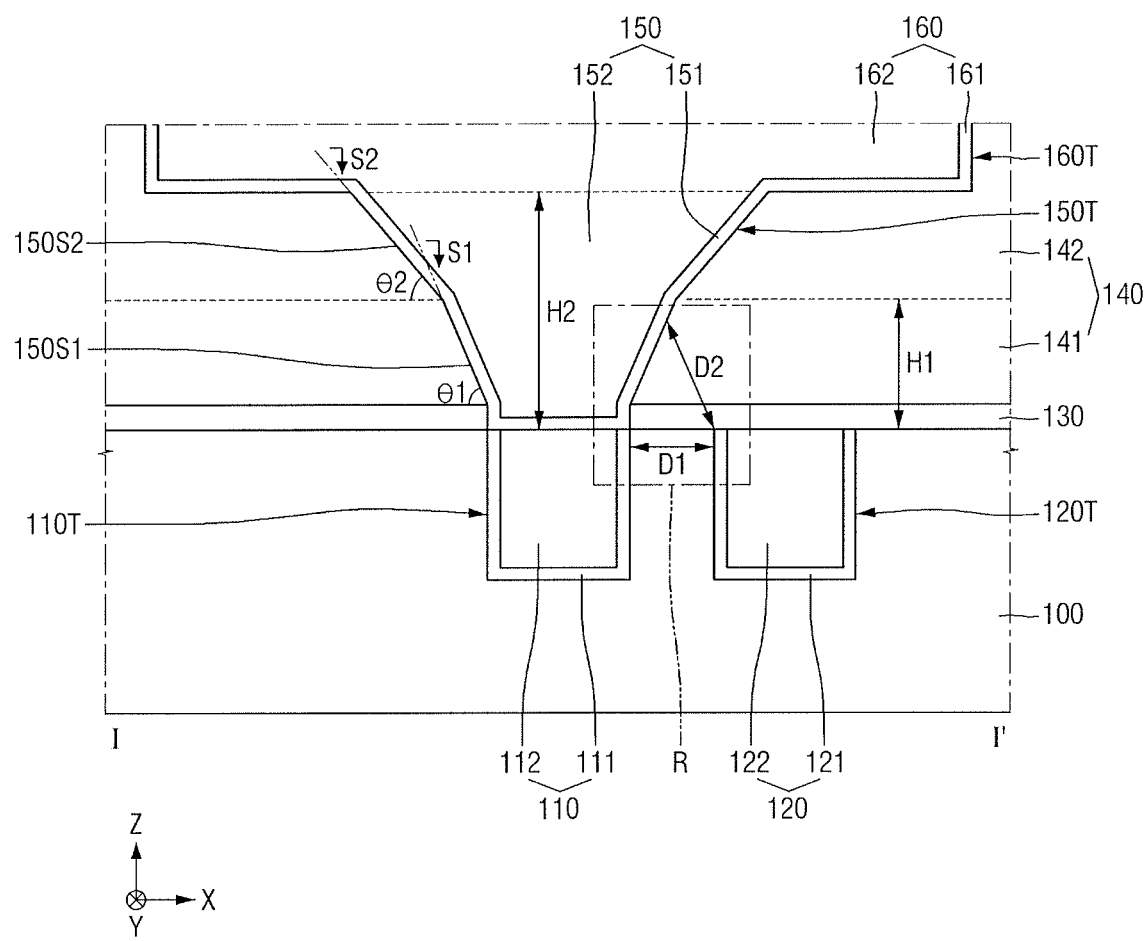
FIG. 2 illustrates a cross-sectional view along line I-I' of FIG. 1.
Figure 3:
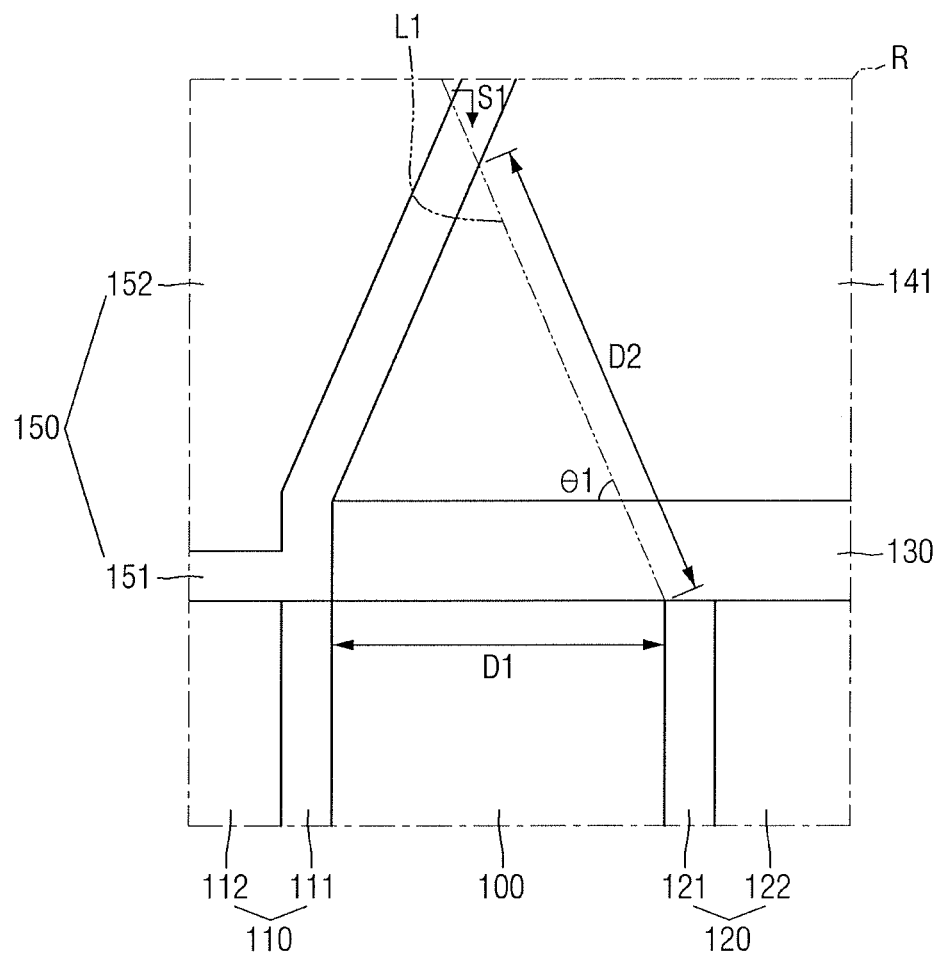
FIG. 3 illustrates an enlarged view of part R of FIG. 2.

FIG. 1 is a layout diagram of a semiconductor device according to some embodiments. FIG. 2 is a cross-sectional view taken along line I-I' of FIG. 1, and FIG. 3 is an enlarged view of part R of FIG. 2. FIG. 1 illustrates a configuration in which some constituent elements, e.g., an etching stop film and an interlayer insulating film, are omitted for convenience of description.

Referring to FIGS. 1 and 2, a semiconductor device 10 according to some embodiments may include a substrate 100, a first lower wiring 110, a second lower wiring 120, an etching stop film 130, an interlayer insulating film 140, a via 150, and an upper wiring 160.

According to some embodiments, the first lower wiring 110 and the second lower wiring 120 may each extend in a second direction Y. The first lower wiring 110 and the second lower wiring 120 may be spaced part from each other by a first distance D1 in a first direction X. In other words, the first lower wiring 110 and the second lower wiring 120 are arranged side by side, e.g., parallel to each other, and may not intersect each other.

According to some embodiments, the upper wiring 160 may extend in the first direction X. The upper wiring 160 may be disposed on the first lower wiring 110 and the second lower wiring 120. At least a part of the upper wiring 160 may overlap the first lower wiring 110 in a third direction Z. Further, at least a part of the upper wiring 160 may overlap the second lower wiring 120 in the third direction Z. In other words, the upper wiring 160 may intersect the first lower wiring 110 and the second lower wiring 120.

The substrate 100 according to some embodiments may include, e.g., a silicon substrate, a gallium arsenide substrate, a silicon germanium substrate, a ceramic substrate, a quartz substrate, a display glass substrate, or the like, and may include an SOI (Semiconductor On Insulator) substrate, but embodiments are not limited thereto. In addition, the substrate 100 may include a base substrate having a form in which an insulating film is formed on a silicon substrate, but embodiments are not limited thereto.

For example, the substrate 100 may include a conductive pattern. The conductive pattern may be a metal wiring or a contact, and may be a gate electrode of a transistor, a source/drain of the transistor, a diode, or the like, but embodiments are not limited thereto. In other words, the substrate 100 may include a base substrate of a semiconductor device and an epilayer. That is, the substrate 100 may include an FEOL (Front End Of Line) region of the semiconductor device.

According to some embodiments, the substrate 100 may include the first lower wiring 110 and the second lower wiring 120. The first lower wiring 110 and the second lower wiring 120 may include a conductive material. For example, each of the first lower wiring 110 and the second lower wiring 120 may be, but is not limited to, a gate electrode, a source electrode, a drain electrode, a diode, or the like of a transistor included in the substrate 100.

The first lower wiring 110 may include a first lower barrier film 111 and a first lower conductive pattern 112. The first lower barrier film 111 may be formed along sidewalls of the first lower conductive pattern 112 and a bottom surface of the first lower conductive pattern 112. In other words, the first lower barrier film 111 may be formed, e.g., conformally, along the sidewalls and the bottom surface of the first lower wiring trench 110T. That is, the first lower barrier film 111 may be disposed between the substrate 100 and the first lower conductive pattern 112. The first lower barrier film 111 may include, but is not limited to, e.g., at least one of tantalum (Ta), tantalum nitride (TaN), titanium (Ti), titanium nitride (TiN), ruthenium (Ru), cobalt (Co), nickel (Ni), nickel boron (NiB), and tungsten nitride (WN).

The second lower wiring 120 may include a second lower barrier film 121 and a second lower conductive pattern 122. The second lower barrier film 121 may be formed along sidewalls of the second lower conductive pattern 122 and a bottom surface of the second lower conductive pattern 122. In other words, the second lower barrier film 121 may be formed, e.g., conformally, along the sidewalls and a bottom surface of a second lower wiring trench 120T. That is, the second lower barrier film 121 may be disposed between the substrate 100 and the second lower conductive pattern 122. The second lower barrier film 121 may include, but is not limited to, e.g., at least one of tantalum (Ta), tantalum nitride (TaN), titanium (Ti), titanium nitride (TiN), ruthenium (Ru), cobalt (Co), nickel (Ni), nickel boron (NiB), and tungsten nitride (WN).

Although the first lower barrier film 111 and the second lower barrier film 121 are illustrated as having a single layer structure, embodiments are not limited thereto. For example, the first lower barrier film 111 and the second lower barrier film 121 may each include a plurality of layers. In another example, the first lower barrier film 111 has a single layer structure, and the second lower barrier film 121 may include a plurality of layers. In still another example, the first lower barrier film 111 may include a plurality of layers, and the second lower barrier film 121 may have a single layer structure.

In some embodiments, the first lower conductive pattern 112 may be formed on the first lower barrier film 111. For example, the first lower conductive pattern 112 may be formed by filling the remaining portions, except the first lower barrier film 111, in the first lower wiring trench 110T. The first lower conductive pattern 112 may include, but is not limited to, at least one of aluminum (Al), copper (Cu), tungsten (W), cobalt (Co), and combinations thereof.

In some embodiments, the second lower conductive pattern 122 may be formed on the second lower barrier film 121. For example, the second lower conductive pattern 122 may be formed by filling the remaining portions, except the second lower barrier film 121, in the second lower wiring trench 120T. The second lower conductive pattern 122 may include, but is not limited to, for example, at least one of aluminum (Al), copper (Cu), tungsten (W), cobalt (Co), and combinations thereof.

An etching stop film 130 may be disposed on at least a part of the substrate 100. The etching stop film 130 may prevent damage to the first lower wiring 110 and the second lower wiring 120, when forming the first via trench 150T. The etching stop film 130 may include a combination of silicon (Si), carbon (C), nitrogen (N), oxygen (O), and aluminum (Al). For example, the etching stop film 130 may include one of silicon carbonitride (SiCN), silicon nitride (SiN), silicon carbide (SiC), aluminum nitride (AlN), aluminum oxide (AlO), and silicon oxycarbide (SiCO). The etching stop film 130 is illustrated as having a single layer structure, but embodiments are not limited thereto. For example, the etching stop film 130 may include a plurality of layers.

An interlayer insulating film 140 may be disposed on the etching stop film 130. The interlayer insulating film 140 may include a first material. The first material may be a low dielectric constant (low-K) material. In some embodiments, the first material may be one of, e.g., silicon oxide, silicon nitride, silicon oxynitride, and silicon oxycarbide. For example, the first material may be octamethylcyclotetrasiloxane (OMCTS). Hereinafter, for convenience of explanation, the interlayer insulating film 140 will be described as containing octamethylcyclotetrasiloxane, but embodiments are not limited thereto.

The interlayer insulating film 140 may include a first portion 141 and a second portion 142. The second portion 142 of the interlayer insulating film 140 may be disposed on the first portion 141 of the interlayer insulating film 140, e.g., the first portion 141 may be between the etching stop film 130 and the second portion 142. The first portion 141 of the interlayer insulating film 140 and the second portion 142 of the interlayer insulating film 140 may include the same first material. In some embodiments, the first portion 141 of the interlayer insulating film 140 and the second portion 142 of the interlayer insulating film 140 may be formed in-situ.

According to some embodiments, the first portion 141 of the interlayer insulating film 140 may include the first material having a first density. Also, the second portion 142 of the interlayer insulating film 140 may include the first material having a second density. At this time, the first density may be greater than the second density.

According to some embodiments, the dielectric constant of the first portion 141 of the interlayer insulating film 140 may be greater than the dielectric constant of the second portion 142 of the interlayer insulating film 140.

According to some embodiments, an oxygen content of the first portion 141 of the interlayer insulating film 140 may be greater than an oxygen content of the second portion 142 of the interlayer insulating film 140.

According to some embodiments, an etch rate of the first portion 141 of the interlayer insulating film 140 may be smaller than the etch rate of the second portion 142 of the interlayer insulating film 140.

According to some embodiments, an interfacial adhesion of the first portion 141 of the interlayer insulating film 140 may be higher than an interfacial adhesion of the second portion 142 of the interlayer insulating film 140.

According to some embodiments, the elastic modulus and the hardness of the first portion 141 of the interlayer insulating film 140 may be greater than the elastic modulus and hardness of the second portion 142 of the interlayer insulating film 140. In other words, durability of the first portion 141 of the interlayer insulating film 140 may be higher than that of the second portion 142 of the interlayer insulating film 140.

The upper wiring 160 may be formed on the substrate 100. The upper wiring 160 may be formed on at least some of the first lower wiring 110 and the second lower wiring 120. In other words, the upper wiring 160 may overlap at least some of the first lower wiring 110 and the second lower wiring 120 in the third direction Z. In some embodiments, the upper wiring 160 may be disposed within the interlayer insulating film 140. For example, the upper wiring 160 may be disposed in the second portion 142 of the interlayer insulating film 140. The upper wiring 160 may include a second upper barrier film 161 and an upper conductive pattern 162. The second upper barrier film 161 may be formed along the sidewalls of the upper conductive pattern 162 and a part of the bottom surface of the upper conductive pattern 162. In other words, the second upper barrier film 161 may be formed along some of the sidewalls and the bottom surface of the upper wiring trench 160T. That is, the second upper barrier film 161 may be disposed between the interlayer insulating film 140 and the upper conductive pattern 162. The second upper barrier film 161 may include, but is not limited to, e.g., one of tantalum (Ta), tantalum nitride (TaN), titanium (Ti), titanium nitride (TiN), ruthenium (Ru), cobalt (Co), nickel (Ni), nickel boron (NiB), and tungsten nitride (WN), but the embodiments are not limited thereto.

In some embodiments, the upper conductive pattern 162 may be formed on the second upper barrier film 161. For example, the upper conductive pattern 162 may be formed by filling the remaining portions, except the second upper barrier film 161, in the upper wiring trench 160T. The upper conductive pattern 162 may include, but is not limited to, e.g., at least one of aluminum (Al), copper (Cu), tungsten (W), cobalt (Co), and combinations thereof.

A via 150 may be formed on the substrate 100. The via 150 may be formed on at least a part of the first lower wiring 110. In other words, the via 150 may overlap at least a part of the first lower wiring 110 in the third direction Y. The via 150 may electrically connect the first lower wiring 110 and the upper wiring 160.

In some embodiments, the via 150 may be formed in the interlayer insulating film 140. The via 150 may include a first upper barrier film 151 and a via conductive pattern 152. The first upper barrier film 151 may be formed along the sidewalls of the via conductive pattern 152 and the bottom surface of the via conductive pattern 152. In other words, the first upper barrier film 151 may be formed along the sidewall and the bottom surface of the via trench 150T. That is, the first upper barrier film 151 may be disposed between the interlayer insulating film 140 and the via conductive pattern 152. The first upper barrier film 151 may include, e.g., at least one of tantalum (Ta), tantalum nitride (TaN), titanium (Ti), titanium nitride (TiN), ruthenium (Ru), cobalt (Co), nickel (Ni), nickel boron (NiB) and tungsten nitride (WN), but the embodiments are not limited thereto.

In some embodiments, the via conductive pattern 152 may be formed on the first upper barrier film 151. For example, the via conductive pattern 152 may be formed by filling the remaining portions, except the first upper barrier film 151, in the via trench 150T. The via conductive pattern 152 may include, e.g., at least one of aluminum (Al), copper (Cu), tungsten (W), cobalt (Co), and combinations thereof, but the embodiments are not limited thereto.

Although the first upper barrier film 151 and the second upper barrier film 161 are illustrated as having a single layer structure, embodiments are not limited thereto. For example, the first upper barrier film 151 and the second upper barrier film 161 may include a plurality of layers.

The first upper barrier film 151 may be connected to the second upper barrier film 161. The via conductive pattern 152 may be connected to the upper conductive pattern 162. In some embodiments, the first upper barrier film 151 and the second upper barrier film 161 may be formed through the same process, e.g., the first upper barrier film 151 and the second upper barrier film 161 may be continuous with each other to define a single film. Further, the via conductive pattern 152 and the upper conductive pattern 162 may be formed through the same process, e.g., the via conductive pattern 152 and the upper conductive pattern 162 may be integral with each other to define a single, e.g., unified, and seamless structure. Although the first upper barrier film 151, the second upper barrier film 161, the via conductive pattern 152, and the upper conductive pattern 162 may be formed in-situ, embodiments are not limited thereto. For example, the first upper barrier film 151, the second upper barrier film 161, the via conductive pattern 152, and the upper conductive pattern 162 may be formed through various processes.

According to some embodiments, a first height H1 from the upper surface of the substrate 100 to the upper surface of the first portion 141 of the interlayer insulating film 140 may be smaller than a second height H2 from the upper surface of the substrate 100 to the upper surface of the via 150. At this time, the via 150 may be formed in the first portion 141 and the second portion 142 of the interlayer insulating film 140, e.g., the via 150 may extend through the first portion 141 and through a portion of the second portion 142 of the interlayer insulating film 140. For convenience of explanation, the sidewall of the via 150 formed in the first portion 141 of the interlayer insulating film 140 is defined as a first sidewall 150S1, and the sidewall of the via 150 formed in the second portion 142 of the interlayer insulating film 140 is defined as a second sidewall 150S2.

The surface of the second sidewall 150S2 of the via 150 may be rougher than the surface of the first sidewall 150S1 of the via 150. In other words, the roughness of the first sidewall 150S1 of the via 150 may be smaller than the roughness of the second sidewall 150S2 of the via 150. Such a feature may be attributed to the fact that durability of the first portion 141 of the interlayer insulating film 140 is higher than that of the second portion 142 of the interlayer insulating film 140. Therefore, the roughness of the first upper barrier film 151 on the first sidewall 150S1 may be improved.

The first sidewall 150S1 of the via 150 may form a first angle $\theta 1$ with the substrate 100. In other words, the first sidewall 150S1 of the via 150 may have a first slope S1. The first angle $\theta 1$ may be greater than 60°, and may be smaller than or equal to 90°. The second sidewall 150S2 of the via 150 may form a second angle $\theta 2$ with the substrate 100. In other words, the second sidewall 150S2 of the via 150 may have a second slope S2. The second angle $\theta 2$ may be greater than 0°, and may be smaller than or equal to 90°. In some embodiments, the first angle $\theta 1$ may be greater than the second angle $\theta 2$. In other words, the first slope S1 may be greater than the second slope S2. However, embodiments are not limited thereto. For example, in some other embodiments, the second slope S2 may be greater than the first slope S1.

Referring to FIG. 3, a second distance D2 between the second lower wiring 120 and the via 150 is defined.

Referring to FIGS. 2-3, a second distance D2 refers to a shortest distance between the via 150 measured at the first slope S1 and the second lower wiring 120. In other words, as illustrated in FIG. 3, when an imaginary line L1 having the first slope S1 is drawn to pass through the second lower wiring 120 and the via 150, the shortest distance among the distances between the point on which the second lower wiring 120 intersects the imaginary line L1 and the point on which the via 150 intersects the imaginary line L1 is defined as the second distance D2.

Referring again to FIGS. 1 and 2, in some embodiments, the first distance D1, i.e., the distance between the first lower wiring 110 and the second lower wiring 120 along the first direction X, is smaller than the second distance D2, i.e., the shortest distance between the second lower wiring 120 and the via 150. Further, the second height H2 from the upper surface of the substrate 100 to the upper surface of the via 150 may be greater than or equal to the second distance D2 between the second lower wiring 120 and the via 150. In some embodiments, since the second distance D2 is greater than the first distance D1, diffusion of the conductive material from the via 150 to the second lower wiring 120 may decrease. Further, since the second height H2 is larger than the first distance D1, diffusion of the conductive material from the upper wiring 160 to the second lower wiring 120 may decrease. In other words, leakage from the via 150 and the upper wiring 160 to the second lower wiring 120 may be reduced.

Figure 4:
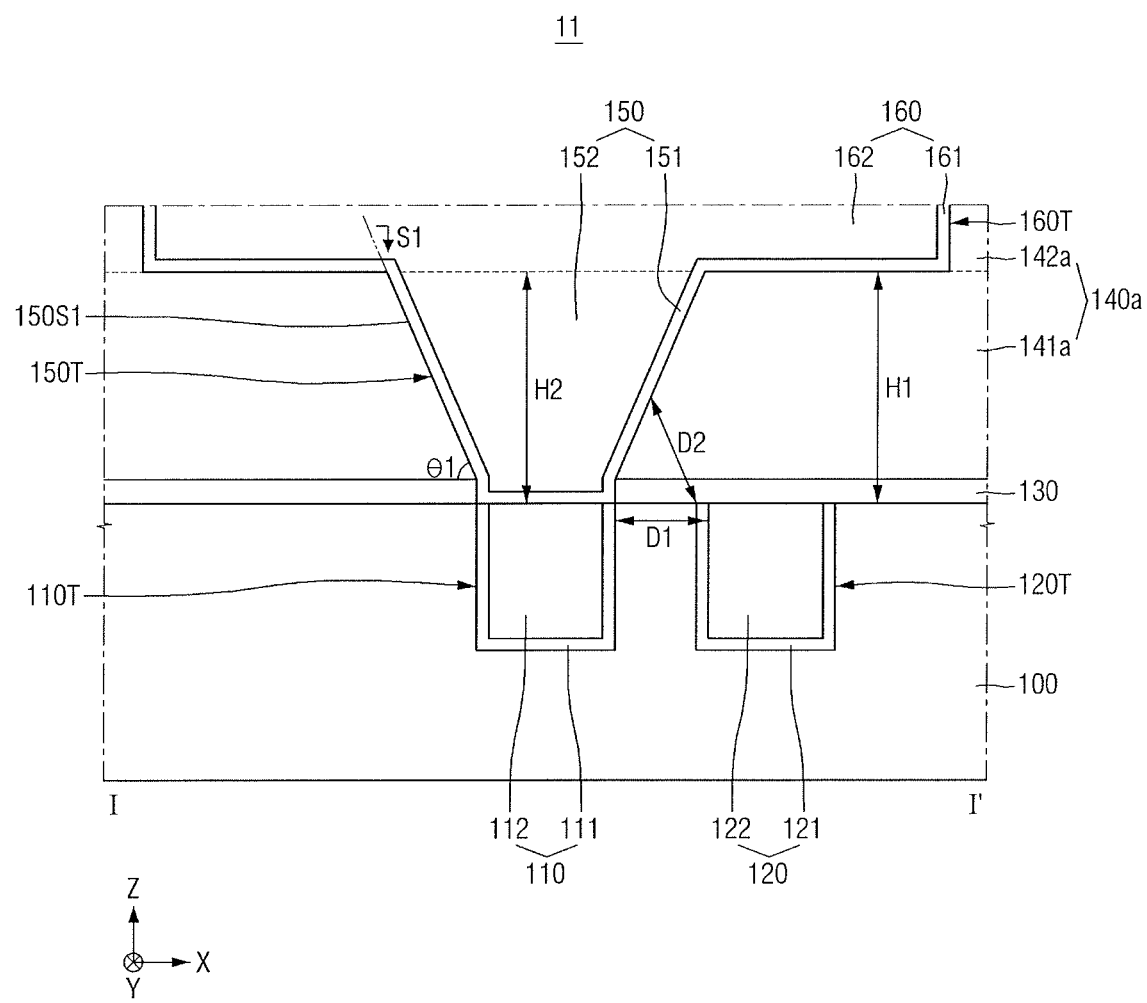
FIG. 4 illustrates a cross-sectional view along line I-I' of FIG. 1 according to some other embodiments.

FIG. 4 is a cross-sectional view taken along line I-I' of FIG. 1 to describe a semiconductor device according to some other embodiments. For convenience of explanation, the same or similar contents as those described above will be omitted or only briefly explained.

Referring to FIG. 4, a semiconductor device 11 according to some embodiments may include the substrate 100, the first lower wiring 110, the second lower wiring 120, the etching stop film 130, an interlayer insulating film 140a, the via 150, and the upper wiring 160.

The interlayer insulating film 140a may include a first portion 141a and a second portion 142a. The second portion 142a of the interlayer insulating film 140a may be disposed on the first portion 141a of the interlayer insulating film 140a. The first portion 141a of the interlayer insulating film 140a and the second portion 142a of the interlayer insulating film 140a may include the same first material. In other words, the first portion 141a of the interlayer insulating film 140a and the second portion 142a of the interlayer insulating film 140a may be formed in-situ.

According to some embodiments, a first height H1' from the upper surface of the substrate 100 to the upper surface of the first portion 141a of the interlayer insulating film 140a may be substantially the same as the second height H2 from the upper surface of the substrate 100 to the upper surface of the via 150a. In other words, the via 150a may be formed only in the first portion 141a of the interlayer insulating film 140a, and the upper wiring 160 may be formed only in the second portion 142a of the interlayer insulating film 140a. In the present specification, the expression "substantially the same" is meant to include a minute difference such as process error.

The first sidewall 150S1 of the via 150 may form a first angle θ1 with the substrate 100. In other words, the first sidewall 150S1 of the via 150 may have a first slope S1, e.g., the via 150 may include a sidewall with a constant slope from the bottom to the top thereof The first angle θ1 may be greater than 60°, and may be smaller than or equal to 90°.

In some embodiments, the first distance D1 at which the first lower wiring 110 and the second lower wiring 120 are spaced apart from each other may be smaller than the second distance D2 between the second lower wiring 120 and the via 150. Further, the second height H2 from the upper surface of the substrate 100 to the upper surface of the via 150 may be greater than or equal to the second distance D2 between the second lower wiring 120 and the via 150. In some embodiments, since the second distance D2 is greater than the first distance D1, diffusion of the conductive material from the via 150 to the second lower wiring 120 may decrease. Further, since the second height H2 is greater than the first distance D1, diffusion of the conductive material from the upper wiring 160 to the second lower wiring 120 may decrease. In other words, leakage from the via 150 and the upper wiring 160 to the second lower wiring 120 may decrease.

Figure 5:
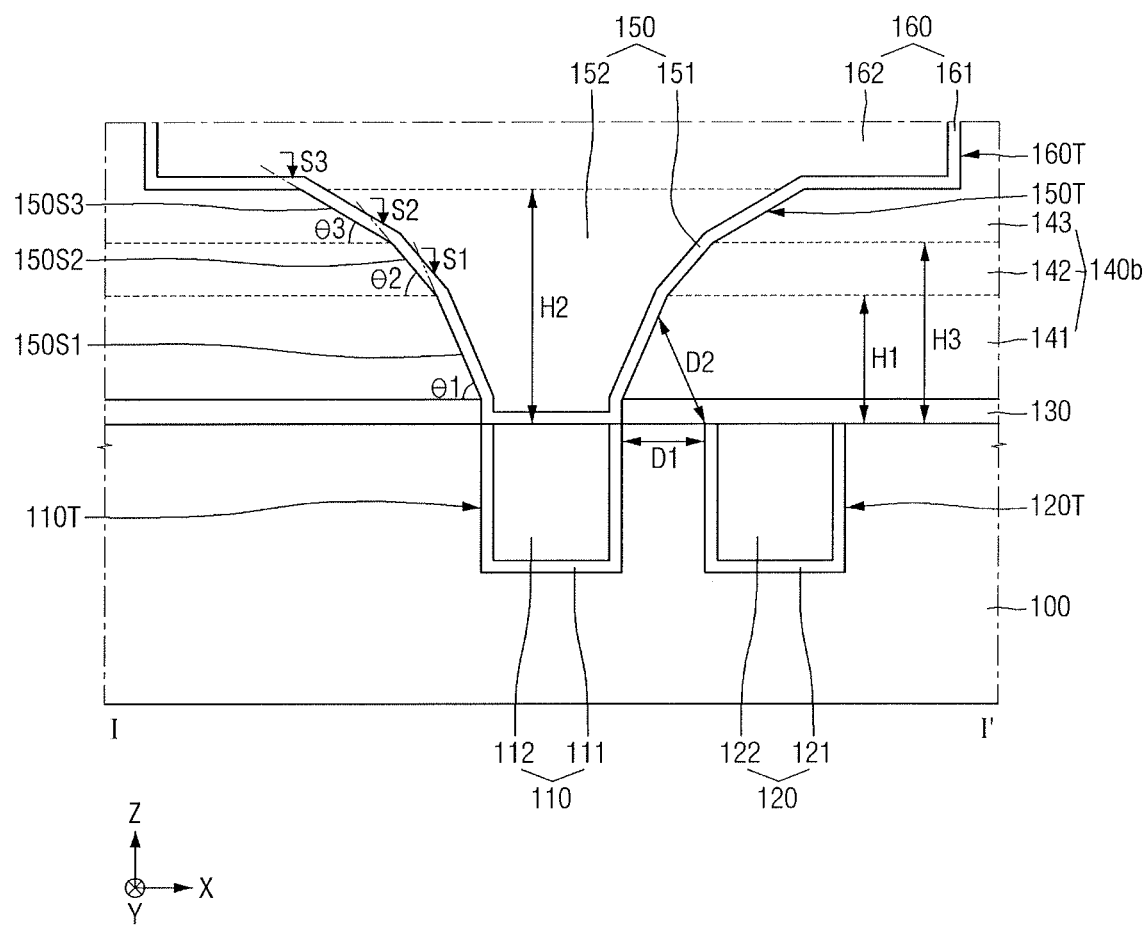
FIG. 5 illustrates a cross-sectional view along line I-I' of FIG. 1 according to another embodiment.

FIG. 5 is a cross-sectional view taken along the line I-I' of FIG. 1 to describe a semiconductor device according to another embodiment. For convenience of explanation, the same or similar contents as those described above will be omitted or only briefly explained.

Referring to FIG. 5, a semiconductor device 12 according to some embodiments may include the substrate 100, the first lower wiring 110, the second lower wiring 120, the etching stop film 130, an interlayer insulating film 140b, a via 150, and the upper wiring 160.

The interlayer insulating film 140b may include the first portion 141, the second portion 142, and a third portion 143. The second portion 142 of the interlayer insulating film 140b may be disposed on the first portion 141 of the interlayer insulating film 140b. The third portion 143 of the interlayer insulating film 140b may be disposed on the second portion 142 of the interlayer insulating film 140b. The first portion 141, the second portion 142, and the third portion 143 of the interlayer insulating film 140b may include the same first material. In some embodiments, the first portion 141, the second portion 142, and the third portion 143 of the interlayer insulating film 140b may be formed in-situ.

According to some embodiments, the first portion 141 of the interlayer insulating film 140b may include the first material having a first density. Also, the second portion 142 of the interlayer insulating film 140b may include the first material having a second density. The third portion 143 of the interlayer insulating film 140b may include the first material having a third density. At this time, the first density may be greater than the second density. The third density may be the same as or different from the first density and the second density. In some embodiments, the third density may be smaller than the second density, but the embodiment is not limited thereto.

According to some embodiments, the first height H1 from the upper surface of the substrate 100 to the upper surface of the first portion 141 of the interlayer insulating film 140b may be smaller than the second height H2 from the upper surface of the substrate 100 to the upper surface of the via 150. Further, a third height H3 from the upper surface of the substrate 100 to the upper surface of the second portion 142 of the interlayer insulating film 140b may be smaller than the second height H2 from the upper surface of the substrate 100 to the upper surface of the via 150. In other words, the via 150 may be formed in the first portion 141, the second portion 142, and the third portion 143 of the interlayer insulating film 140b.

For convenience of explanation, the sidewall of the via 150 formed in the first portion 141 of the interlayer insulating film 140b is defined as the first sidewall 150S1, the sidewall of the via 150 formed in the second portion 142 of the interlayer insulating film 140b is defined as a second sidewall 150S2, and the sidewall of the via 150 formed in the third portion 143 of the interlayer insulating film 140b is defined as a third sidewall 150S3.

The first sidewall 150S1 of the via 150b may form the first angle θ1 with the substrate 100. In other words, the first sidewall 150S1 of the via 150 may have the first slope S1. The first angle θ1 may be greater than 60° and may be smaller than or equal to 90°. The second sidewall 150S2 of the via 150 may form the second angle θ2 with the substrate 100. In other words, the second sidewall 150S2 of the via 150 may have the second slope S2. The second angle θ2 may be greater than 0°, and may be smaller than or equal to 90°. The third sidewall 150S3 of the via 150 may form a third angle θ3 with the substrate 100. In other words, the third sidewall 150S3 of the via 150 may have a third slope S3. The third angle θ3 may be greater than 0°, and may be smaller than or equal to 90°.

In some embodiments, the first angle θ1 may be greater than the second angle θ2. Also, the second angle θ2 may be greater than the third angle θ3. In other words, the first slope S1 may be greater than the second slope S2, and the second slope S2 may be greater than the third slope S3. However, embodiments are not limited thereto. For example, the second angle θ2 may be greater than the first angle θ1, and the third angle θ3 may be greater than the second angle θ2.

In some embodiments, the first distance D1 at which the first lower wiring 110 and the second lower wiring 120 are spaced apart from each other may be smaller than the second distance D2 between the second lower wiring 120 and the via 150. Further, the second height H2 from the upper surface of the substrate 100 to the upper surface of the via 150 may be greater than or equal to the second distance D2 between the second lower wiring 120 and the via 150. In some embodiments, since the second distance D2 is greater than the first distance D1, diffusion of the conductive material from the via 150 to the second lower wiring 120 may decrease. Further, since the second height H2 is greater than the first distance D1, diffusion of the conductive material from the upper wiring 160 to the second lower wiring 120 may be reduced. In other words, the leakage current from the via 150 and the upper wiring 160 to the second lower wiring 120 may be reduced.

Figure 6:
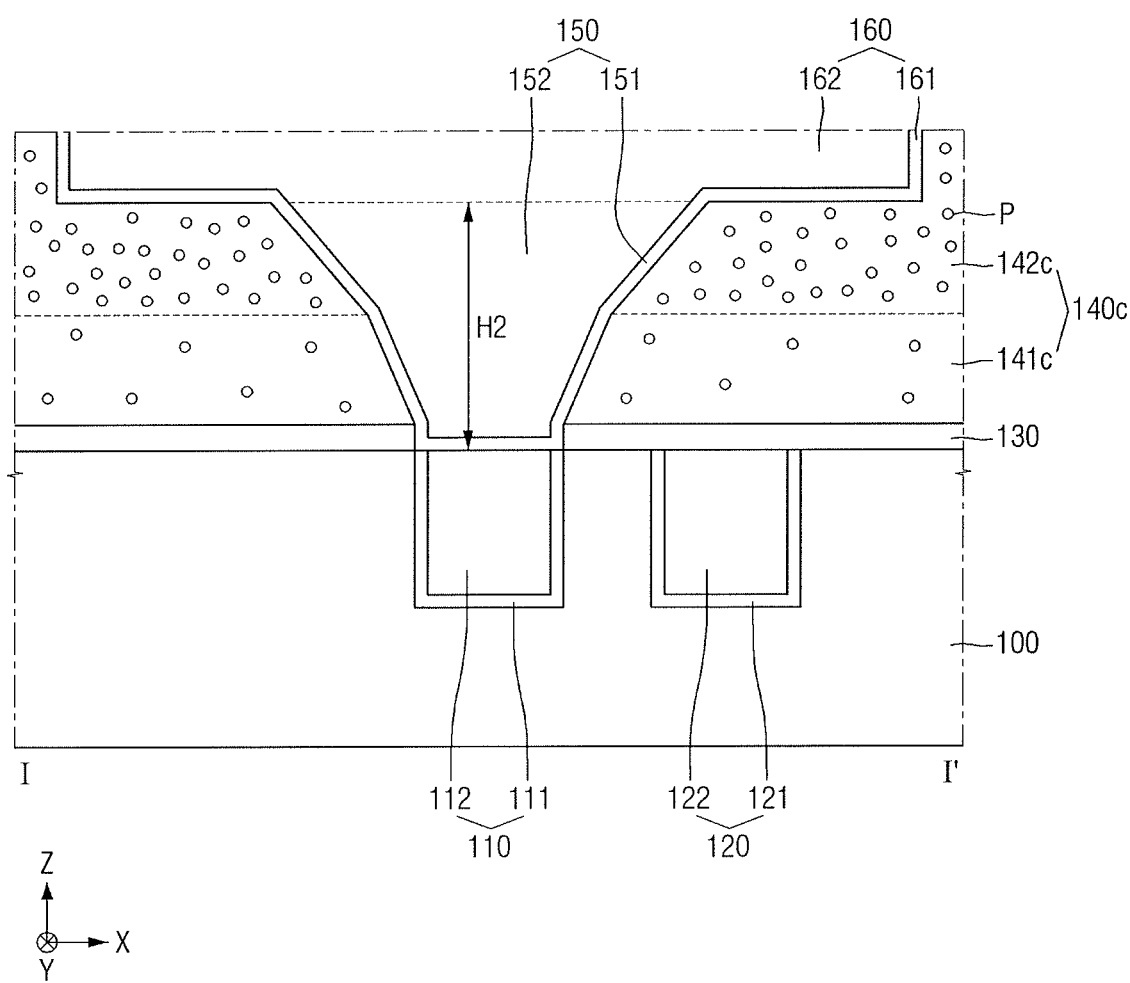
FIG. 6 illustrates a cross-sectional view along line I-I' of FIG. 1 according to another embodiment.

FIG. 6 is a cross-sectional view taken along the line I-I' of FIG. 1 to describe a semiconductor device according to another embodiment. For convenience of explanation, the same or similar contents as those described above will be omitted or only briefly explained.

Referring to FIG. 6, a semiconductor device 13 according to some embodiments may include the substrate 100, the first lower wiring 110, the second lower wiring 120, the etching stop film 130, an interlayer insulating film 140c, the via 150, and the upper wiring 160.

The interlayer insulating film 140c may include a first portion 141c and a second portion 142c. The second portion 142c of the interlayer insulating film 140c may be disposed on the first portion 141c of the interlayer insulating film 140c. The first portion 141c of the interlayer insulating film 140c and the second portion 142c of the interlayer insulating film 140c may include the same first material. In some embodiments, the first portion 141c of the interlayer insulating film 140c and the second portion 142c of the interlayer insulating film 140c may be formed in-situ.

According to some embodiments, the first portion 141c and the second portion 142c of the interlayer insulating film 140c may include pores P. In some embodiments, the number of pores P included in the first portion 141c of the interlayer insulating film 140c may be smaller than the number of the pores P included in the second portion 142c of the interlayer insulating film 140c. In other words, the porosity of the first portion 141c of the interlayer insulating film 140c may be smaller than the porosity of the second portion 142c of the interlayer insulating film 140c.

A method for fabricating a semiconductor device according to some embodiments will be described with reference to FIGS. 7 to 12. FIGS. 7 to 12 are exemplary cross-sectional views of stages in a method for fabricating a semiconductor device according to some embodiments.

For convenience of explanation, the description of FIGS. 7-12 will be provided on the assumption that the interlayer insulating film 140 includes the first portion 141 and the second portion 142, and the first height H1 from the upper surface of the substrate 100 to the upper surface of the second portion 142 is smaller than the second height H2 from the upper surface of the substrate 100 to the upper surface of the via 150, as described previously with reference to FIGS. 1-3. That is, the semiconductor device fabricated in FIGS. 7 to 12 may be the same as the semiconductor device 10 of FIG. 2. However, the semiconductor devices 11, 12 and 13 in FIGS. 4-6, respectively, may be formed using the same or similar method, and therefore, detailed explanations thereof will not be provided.

Figure 7:
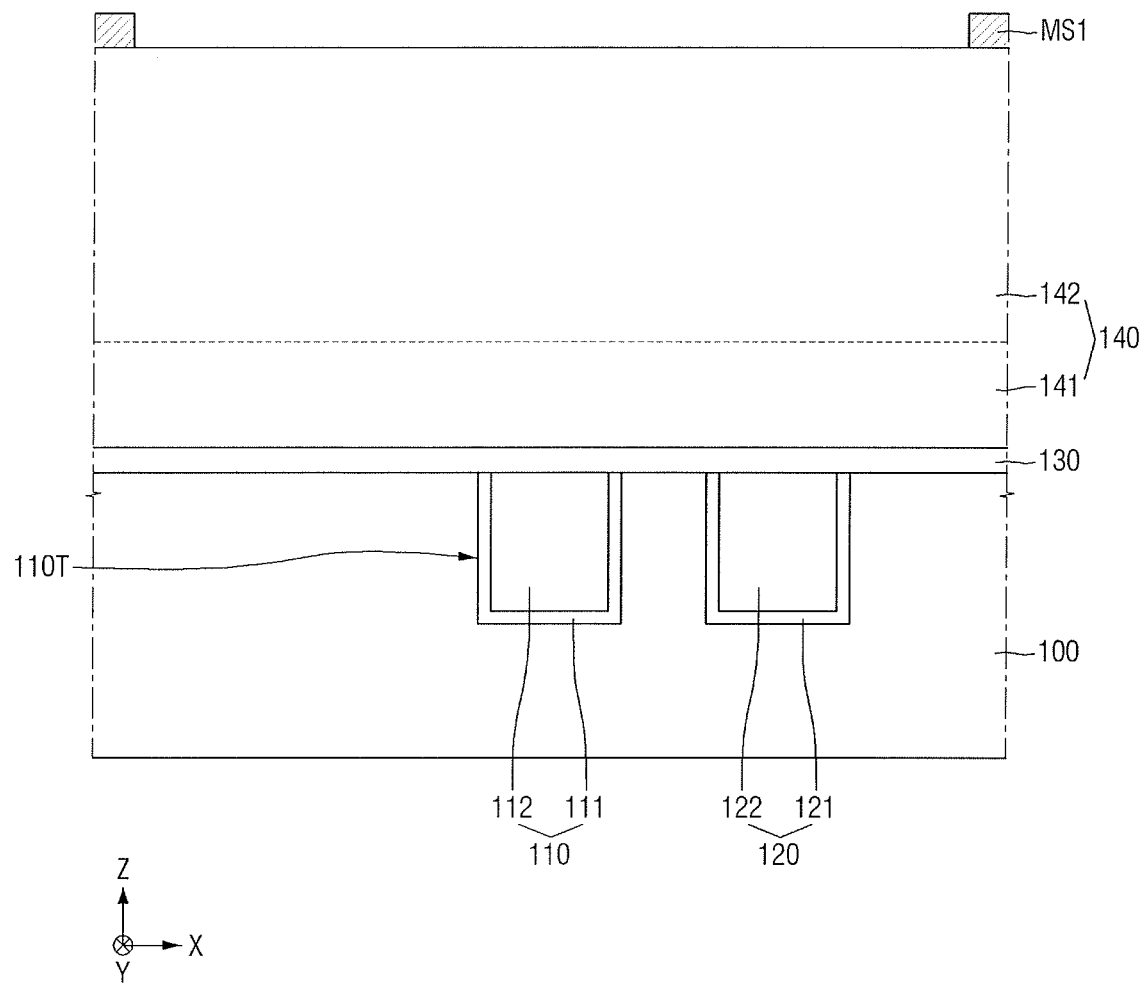
FIGS. 7 to 12 illustrate exemplary cross-sectional views of stages in a method for fabricating a semiconductor device according to some embodiments.

Referring to FIG. 7, the first lower wiring 110 and the second lower wiring 120 may be formed on, e.g., within, the substrate 100. In some embodiments, the first lower wiring 110 may include the first lower barrier film 111 and the first lower conductive pattern 112. The second lower wiring 120 may include the second lower barrier film 121 and the second lower conductive pattern 122. For example, the first lower barrier film 111 may be formed along the sidewalls and the bottom surface of the first lower wiring trench 110T, e.g., via any suitable method. Further, it is possible to form the first lower conductive pattern 112 on the first lower barrier film 111, by filling the remaining portions of the first lower wiring trench 110T with the conductive material. The second lower wiring 120 may be formed in the same process as the first lower wiring 110. For example, top surfaces of the substrate 100 and the first and second lower wirings 110 and 120 may be level.

The etching stop film 130 may be formed on the substrate 100 and the first lower wiring 110, e.g., the etching stop film 130 may be formed to cover the top surfaces of the substrate 100 and the first and second lower wirings 110 and 120. The interlayer insulating film 140 may be formed on the etching stop film 130. The interlayer insulating film 140 may include the first portion 141 and the second portion 142. The first portion 141 of the interlayer insulating film 140 and the second portion 142 of the interlayer insulating film 140 may include the same first material. However, in some embodiments, the density of the first material contained in the first portion 141 of the interlayer insulating film 140 and the second portion 142 of the interlayer insulating film 140 may be different from each other. For example, the first portion 141 of the interlayer insulating film 140 may include the first material having the first density, and the second portion 142 of the interlayer insulating film 140 may include the first material having the second density. The first density may be greater than the second density. In some embodiments, the first portion 141 of the interlayer insulating film 140 and the second portion 142 of the interlayer insulating film 140 may be formed in-situ.

For example, the oxygen flow during formation of the first and second portions 141 and 142 of the interlayer insulating film 140 may be adjusted to provide different densities of the first and second portions 141 and 142. In detail, when forming the first portion 141 of the interlayer insulating film 140, the flow rate of the oxygen (O) gas may be set as a first flow rate, and when forming the second portion 142 of the interlayer insulating film 140, the flow rate of the oxygen (O) gas may be set as a second flow rate. The first flow rate may be greater than the second flow rate to provide for the greater first density. However, the embodiments are not limited thereto. A first mask pattern MS1 may be formed on the interlayer insulating film 140.

Figure 8:
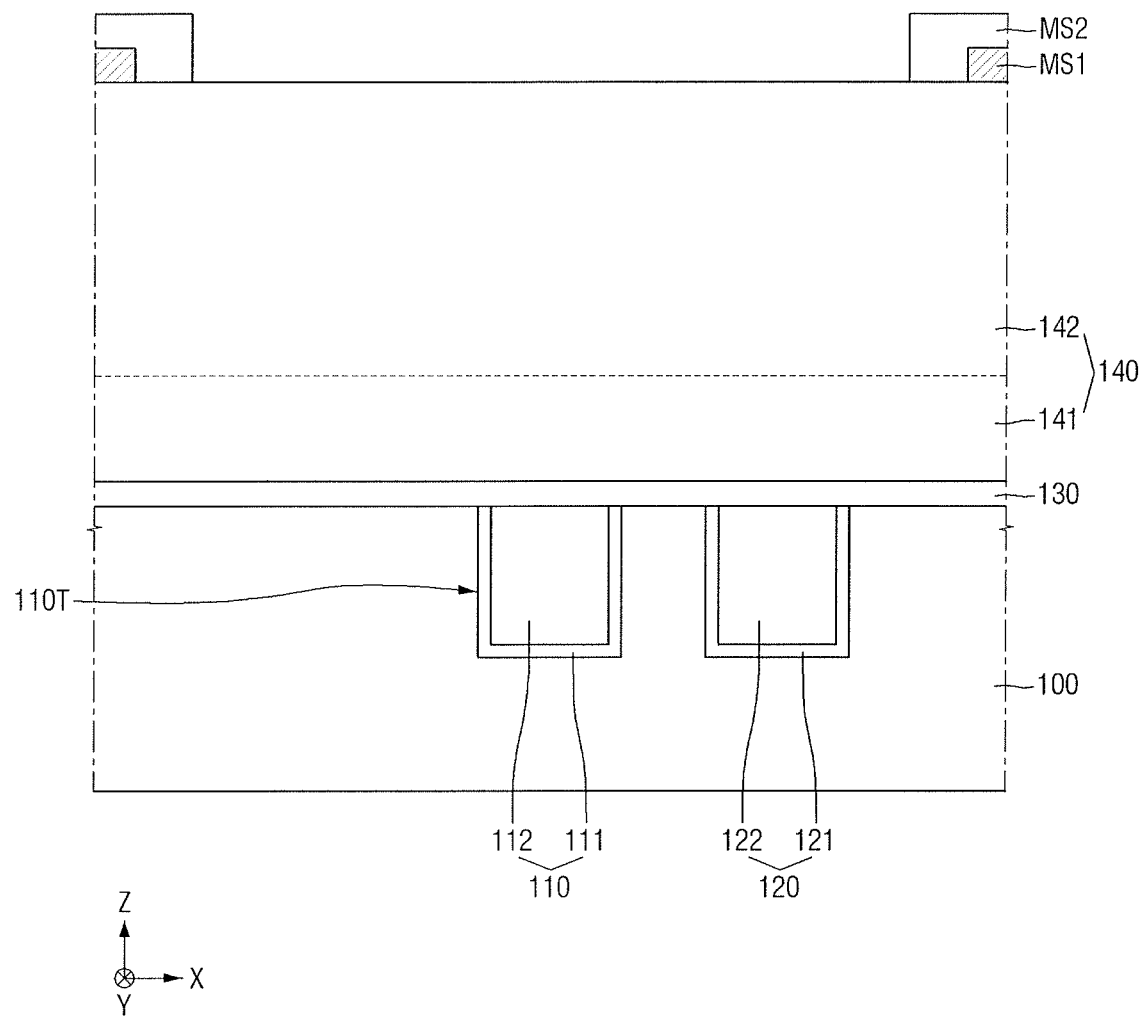

Referring to FIG. 8, a second mask pattern MS2 may be formed on the interlayer insulating film 140 and the first mask pattern MS1. In some embodiments, the second mask pattern MS2 may be formed to cover the first mask pattern MS1. An interval between the second mask patterns MS2 in the first direction X may be narrower than an interval between the first mask patterns MS1 in the first direction X. For example, as illustrated in FIG. 8, the interval between the second mask patterns MS2 overlaps the first and second lower wirings 110 and 120.

Figure 9:
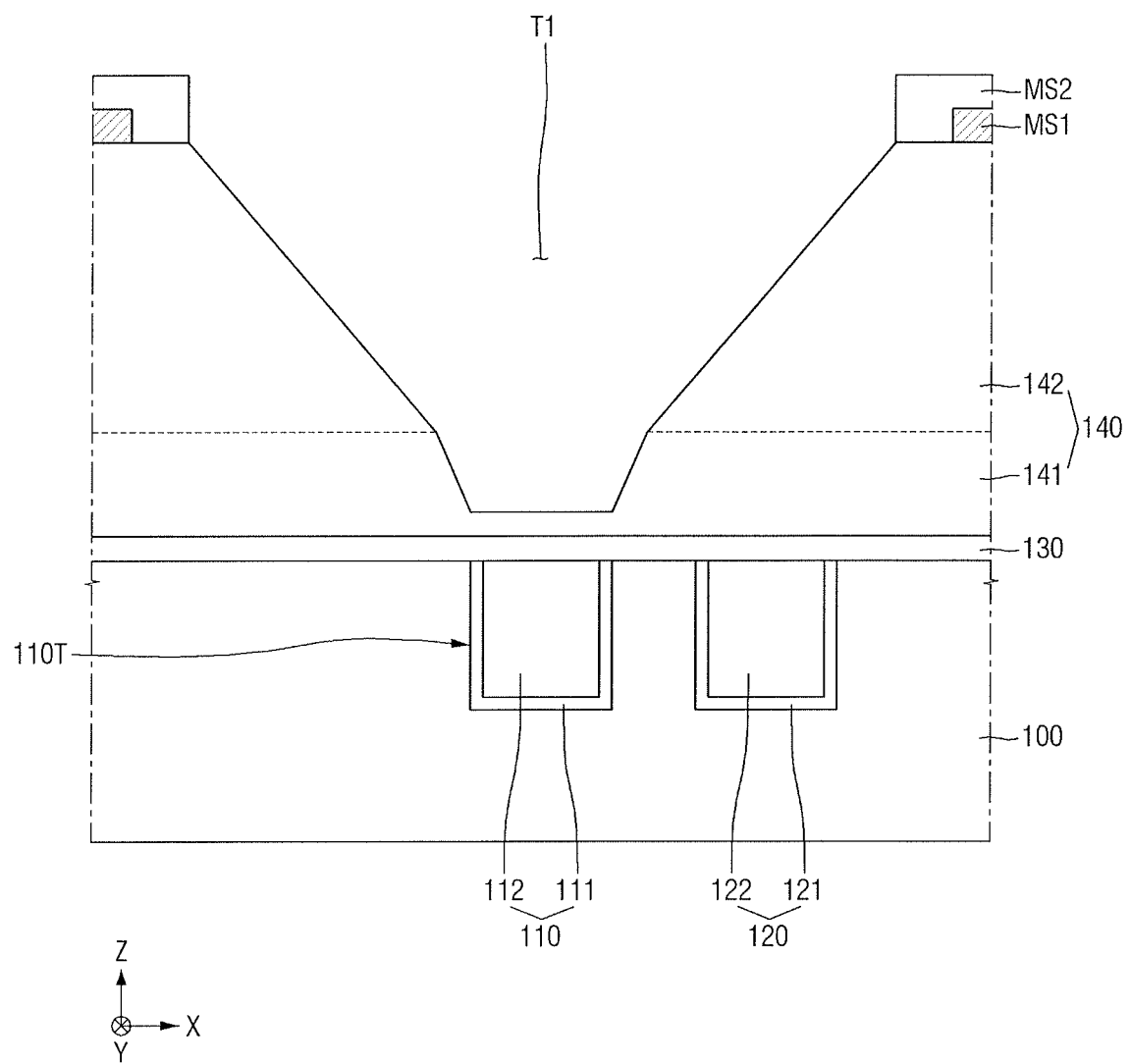

Referring to FIG. 9, a first trench T1 may be formed in the interlayer insulating film 140, e.g., via etching, using the second mask pattern MS2 as an etching mask. FIG. 9 illustrates a configuration in which the first trench T1 is formed in the first portion 141 and the second portion 142 of the interlayer insulating film 140, but embodiments are not limited thereto. For example, the first trench T1 may be formed only in the second portion 142 of the interlayer insulating film 140. For example, as illustrated in FIG. 9, the etch rate of the first portion 141 of the interlayer insulating film 140 may be smaller than the etch rate of the second portion 142 of the interlayer insulating film 140, e.g., due to the different densities thereof, thereby having the bottom of the first trench T1 in the first portion 141 of the interlayer insulating film 140 narrower along the first direction X than the top of the first trench T1 in the second portion 142 of the interlayer insulating film 140 along the first direction X. For example, as further illustrated in FIG. 9, the first trench T1 may not expose the etching stop film 130.

Figure 10:
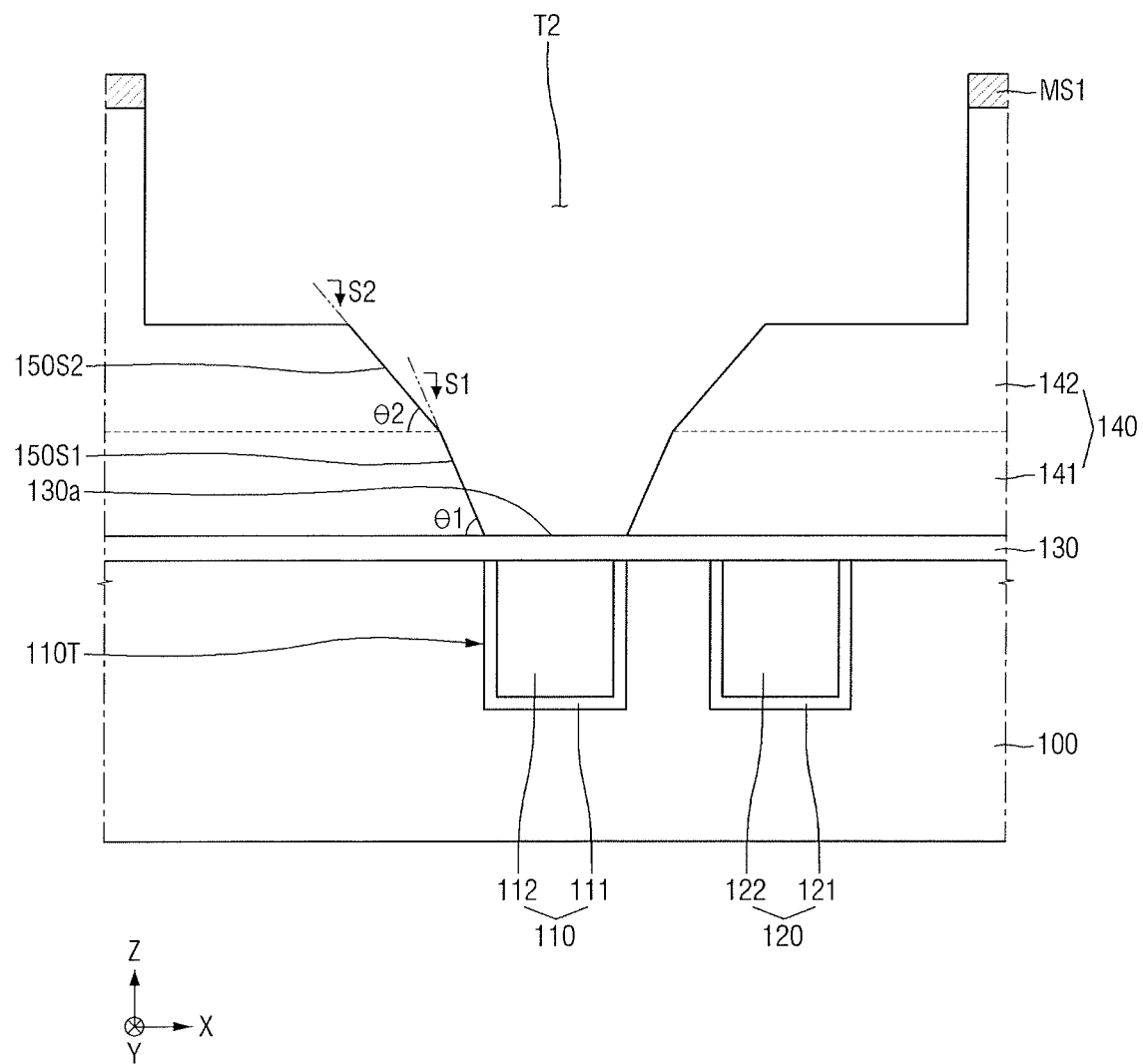

Referring to FIG. 10, the second mask pattern MS2 may be removed. Subsequently, a second trench T2 for exposing an upper surface 130a of the etching stop film 130, e.g., above the first lower wiring 110, may be formed, using the first mask pattern MS1 as an etching mask. At this time, damage to the first lower wiring 110 may be prevented due to the etching stop film 130 covering the first lower wiring 110.

In detail, the second trench T2 may include the first sidewall 150S1 and the second sidewall 150S2. The substrate 100 and the first sidewall 150S1 may form the first angle θ1. In other words, the first sidewall 150S1 may have the first slope S1. The substrate 100 and the second sidewall 150S2 may form the second angle θ2. In other words, the second sidewall 150S2 may have the second slope S2. According to some embodiments, the etch rate of the first portion 141 of the interlayer insulating film 140 may be smaller than the etch rate of the second portion 142 of the interlayer insulating film 140. Therefore, when forming the second trench T2, the first portion 141 of the interlayer insulating film 140 may be removed to be less than second portion 142 of the interlayer insulating film 140, e.g., a smaller portion of the first portion 141 may be removed as compared to the second portion 142. Thus, in some embodiments, the first angle θ1 may be greater than the second angle θ2. In other words, the slopes of the first sidewall 150S1 and the second sidewall 150S2 may be determined, due to a difference in the etch rate between the first portion 141 and the second portion 142 of the interlayer insulating film 140.

Figure 11:
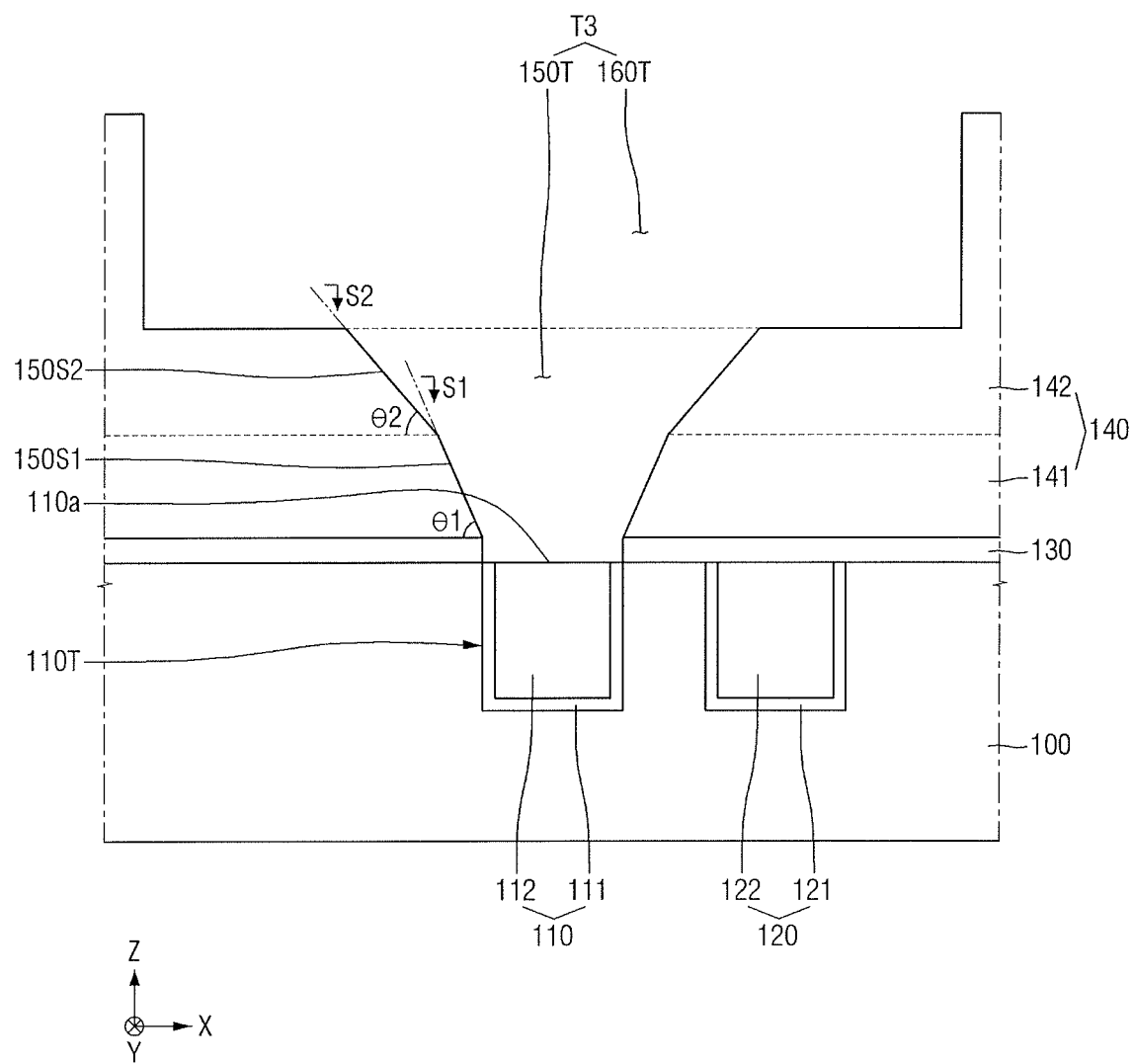

Referring to FIGS. 10 and 11, the second mask pattern MS2 may be removed. A third trench T3 for exposing an upper surface 110a of the first lower wiring 110 may be formed, by removing the upper surface 130a of the exposed etching stop film 130. For example, the third trench T3 may include the via trench 150T and the upper wiring trench 160T, e.g., the via trench 150T and the upper wiring trench 160T may be continuous with each other and in fluid communication with each other.

Figure 12:
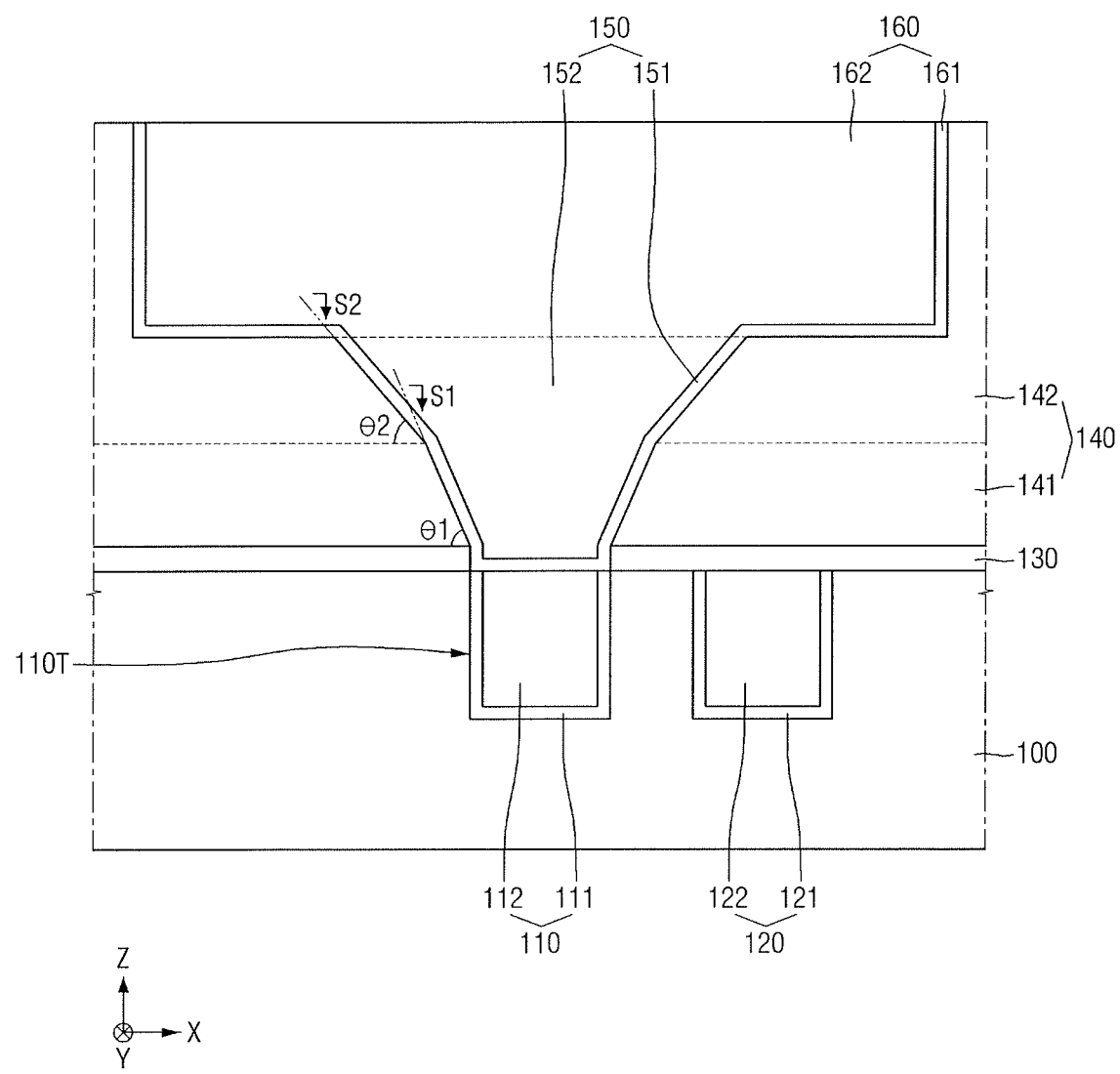

Referring to FIGS. 11 and 12, the first upper barrier film 151 and the second upper barrier film 161 may be formed along the sidewalls and the bottom surface of the third trench T3. The first upper barrier film 151 and the second upper barrier film 161 may be formed by the same process, e.g., as the same continuous film, but embodiments are not limited thereto. By filling the remaining portions of the third trench T3 with the conductive material, the via conductive pattern 152 and the upper conductive pattern 162 may be formed. In other words, the via conductive pattern 152 and the upper conductive pattern 162 may be formed by the same process. However, embodiments are not limited thereto.

By way of summation and review, when intervals between circuit components, e.g., between wirings, decrease, leakage current may occur. Therefore, aspects of embodiments provide a semiconductor device capable of reducing leakage, e.g., diffusion, between a lower wiring and a via adjacent thereto. Aspects of embodiments also provide a method for fabricating a semiconductor device with reduced leakage between the lower wiring and the via adjacent thereto.

That is, according to embodiments, an interlayer insulation layer between the lower wiring and the via adjacent thereto may be formed of a film having increasing density toward the substrate, thereby exhibiting decreasing etching rate toward the substrate, which in turn, facilitates formation of the adjacent via with a decreasing width toward the substrate. The decreasing width of the adjacent via toward the substrate increases the distances between the via and the lower wiring, thereby preventing or substantially minimizing diffusion therebetween.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a lower wiring;
   an interlayer insulation film above the lower wiring, the interlayer insulation film including:
      a first portion having a first density, and
      a second portion on the first portion, the first portion and the second portion including a same material, and the second portion having a second density smaller than the first density;
   an upper wiring in the second portion of the interlayer insulating film; and
   a via in the first portion of the interlayer insulating film, the via connecting the upper wiring and the lower wiring, and at least a part of the via is in the second portion of the interlayer insulating film.

2. The semiconductor device as claimed in claim 1, wherein the interlayer insulating film further includes a third portion having a third density smaller than the first density and the second density.

3. The semiconductor device as claimed in claim 1, wherein the lower wiring includes:
   a lower conductive pattern, and
   a lower barrier film extending along sidewalls and a bottom surface of the lower conductive pattern.

4. The semiconductor device as claimed in claim 1, wherein the interlayer insulating film includes:
   a first upper wiring trench in only part of the second portion of the interlayer insulating film, and
   a first via trench in the first portion and part of the second portion of the interlayer insulating film, the first via trench being in fluid communication with the first upper wiring trench, a width of the first via trench in the second portion of the interlayer insulating film being smaller than a width of the first upper wiring trench,
   wherein a width of the via in the second portion of the interlayer insulating film being larger than a width of the via in the first portion of the interlayer insulating film, the via and the upper wiring being integral with each other within the first upper wiring trench and the first via trench.

5. The semiconductor device as claimed in claim 4, wherein the upper wiring and the via have a unified structure including:
   an upper barrier film extending continuously along sidewalls of the first upper wiring trench, along sidewalls of the first via trench, and along a bottom surface of the first via trench; and
   an upper conductive pattern on the upper barrier film and filling the first upper wiring trench and the first via trench.

6. The semiconductor device as claimed in claim 1, wherein the first portion of the interlayer insulating film has a smaller porosity than a porosity of the second portion of the interlayer insulating film.

7. The semiconductor device as claimed in claim 1, wherein the first portion of the interlayer insulating film has a dielectric constant that is greater than a dielectric constant of the second portion of the interlayer insulating film.

8. The semiconductor device as claimed in claim 1, wherein the first portion of the interlayer insulating film and the second portion of the interlayer insulating film include a same material.

9. The semiconductor device as claimed in claim 8, wherein the first portion of the interlayer insulating film and the second portion of the interlayer insulating film include octamethylcyclotetrasiloxane.

10. The semiconductor device as claimed in claim 9, wherein the first portion of the interlayer insulating film includes a higher oxygen content than that of the second portion of the interlayer insulating film.

11. A method for fabricating a semiconductor device, the method comprising:
    forming a lower wiring;
    forming an interlayer insulating film on the lower wiring, such that the interlayer insulating film includes a first portion having a first density, and a second portion on the first portion and having a second density smaller than the first density, the first portion and the second portion including a same material;
    forming a first mask pattern on the interlayer insulating film;
    removing at least a part of the first portion of the interlayer insulating film and at least a part of the second portion of the interlayer insulating film, using the first mask pattern as an etching mask, such that a trench for exposing the lower wiring is formed; and
    forming a via in the trench, the via connecting an upper wiring and the lower wiring, and at least a part of the via is in the second portion of the interlayer insulating film;
    wherein, during removal of the at least part of the first portion of the interlayer insulating film and the at least part of the second portion of the interlayer insulating film, a first etch rate of the first portion of the interlayer insulating film is smaller than a second etch rate of the second portion of the interlayer insulating film.

12. The method for fabricating the semiconductor device as claimed in claim 11, wherein forming the interlayer insulating film includes forming the first and second portions of the interlayer insulating film in-situ.

13. The method for fabricating the semiconductor device as claimed in claim 12, wherein:
    the first and second portions of the interlayer insulating film are formed of octamethylcyclotetrasiloxane, and
    forming the interlayer insulating film includes adjusting a flow rate of oxygen gas during formation of the second portion of the interlayer insulating film as compared to formation of the first portion of the interlayer insulating film.

14. The method for fabricating the semiconductor device as claimed in claim 13, wherein the flow rate of the oxygen gas during formation of the first portion of the interlayer insulating film is greater than the flow rate of the oxygen gas during formation of the second portion of the interlayer insulating film.

* * * * *